(12) United States Patent
Abdo

(10) Patent No.: US 11,949,387 B2
(45) Date of Patent: *Apr. 2, 2024

(54) BAND-PASS JOSEPHSON TRAVELING WAVE PARAMETRIC AMPLIFIER

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/858,043

(22) Filed: Jul. 5, 2022

(65) Prior Publication Data

US 2022/0360240 A1 Nov. 10, 2022

Related U.S. Application Data

(63) Continuation of application No. 16/749,949, filed on Jan. 22, 2020, now Pat. No. 11,418,162.

(51) Int. Cl.
*H03F 19/00* (2006.01)
*H01L 39/12* (2006.01)
*H10N 60/85* (2023.01)

(52) U.S. Cl.
CPC ............. *H03F 19/00* (2013.01); *H10N 60/85* (2023.02); *H03F 2200/255* (2013.01); *H03F 2200/267* (2013.01); *H03F 2200/423* (2013.01)

(58) Field of Classification Search
CPC ............... H03F 19/00; H03F 2200/255; H03F 2200/267; H03F 2200/423; H03F 3/189;

(Continued)

(56) References Cited

U.S. PATENT DOCUMENTS 7,174,147 B2 * 2/2007 Toncich ............... H03H 7/1791
330/303
8,334,733 B2 * 12/2012 Tamura ............... H03H 7/0115
333/173

(Continued)

FOREIGN PATENT DOCUMENTS

CN 204333585 U 5/2015
CN 106814516 B 6/2019
EP 1 158 659 A1 11/2001

OTHER PUBLICATIONS

Mohebbi, H. R. et al., "Superconducting Coplanar Interdigital Filter with Robust Packaging", IEEE Transactions on Applied Superconductivity, IEEE Service Center, Los Alamitos, CA, US, vol. 25, No. 3, Jun. 2, 2015, 4 pgs., XP011570147.

(Continued)

*Primary Examiner* — Hieu P Nguyen
(74) *Attorney, Agent, or Firm* — Intelletek Law Group, PLLC; Gabriel Daniel, Esq.

(57) ABSTRACT

A bandpass parametric amplifier circuit includes a plurality of unit cells. At least one unit cell includes a first inductor having a first node coupled to a center conductor and a second node coupled to ground. There is a first capacitor having a first node coupled to the center conductor and a second node coupled to ground. There is a second inductor having a first node coupled to the center conductor. A second capacitor has a first node coupled to a second node of the second inductor. The second capacitor and the second inductor are in series with the center conductor.

21 Claims, 3 Drawing Sheets

EXAMPLE LADDER CIRCUIT FOR NDFM WITH $Z_1 = Z_0$

(58) Field of Classification Search
CPC .. H03F 3/60; H03F 7/00; H10N 60/85; H01P 1/20; G06N 10/00
USPC .................................................. 330/286, 302
See application file for complete search history.

(56) References Cited

U.S. PATENT DOCUMENTS

| | | |
|---|---|---|
| 10,396,732 B2 | 8/2019 | Abdo |
| 10,873,302 B2 | 12/2020 | Tan |
| 2018/0048110 A1 | 2/2018 | Jestin et al. |
| 2019/0190474 A1 | 6/2019 | Abdo et al. |
| 2020/0350880 A1* | 11/2020 | Miano .................. H10N 60/805 |

OTHER PUBLICATIONS

Naaman, O. et al., "High Saturation Power Josephson Parametric Amplifier with GHz Bandwidth", 2019 IEEE MTT-S International Microwave Symposium (IMS), IEEE, Jun. 2, 2019, pp. 259-262, XP033579639.

Mendes, U. C., et al., "Parametric amplification and squeezing with ac- and dc-voltage biased superconducting junction", Arxiv.org, Cornell University Library, 201 Olin Library Cornell University Ithaca, NY 14853, Feb. 20, 2018, 8 pgs., XP081217100.

Ferreira, V.S. et al., "Collapse and Revival of an Artificial Atom Coupled to a Structured Photonic Reservoir", Arxiv.org, Cornell University Library, 201 Olin Library Cornell University Ithaca, NY 14853, Jan. 9, 2020, 19 pgs. XP081576018.

Search Report and Written Opinion from related international application No. PCT/EP2021/050762, dated Mar. 25, 2021, 12 pgs.

Miano, A. et al., "Symmetric Traveling Wave Parametric Amplifier"; IEEE Transactions on Applied Superconductivity (2009); vol. 29:5; 6 pgs.

Macklin, C. et al., "A Near-Quantum-Limited Josephson Traveling-Wave Parametric Amplifier"; Science (2015); vol. 350:6258; 4 pgs.

Naaman, O., et al., "Josephson Junction Microwave Modulators for Qubit Control"; J. Appl. Phys. (2017); vol. 121:073904; 8 pgs.

Qin, S. et al., "A Nonreciprocal, Frequency-Tunable Notch Amplifier Based on Distributedly Modulated Capacitors (DMC)"; IEEE (2016); 3 pgs.

Bell, M. T. et al., "Traveling-Wave Parametric Amplifier Based on a Chain of Coupled Asymmetric SQUIDs"; Physical Review Applied (2015); vol. 4:024014; 9 pgs.

Zorin, A. B., "Josephson Traveling-Wave Parametric Amplifier with Three-Wave Mixing"; Physical Review Applied (2016); vol. 6:034006; 8 pgs.

O'Brien, K. et al., "Resonant Phase Matching of Josephson Junction Traveling Wave Parametric Amplifiers"; Physical Review Letters (2014); PRL 113:157001; 5 pgs.

* cited by examiner

BAND-PASS JOSEPHSON TRAVELING WAVE PARAMETRIC AMPLIFIER

BACKGROUND

Technical Field

The present disclosure generally relates to superconducting devices, and more particularly, amplifiers that can be used for qubit readout.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

The electromagnetic energy associated with a qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. The amplitude and/or phase of the returned/output microwave signal carries information about the qubit state, such as whether the qubit is at the ground or excited states or at a superposition of the two states. The microwave signal carrying the quantum information about the qubit state is usually weak (e.g., on the order of a few microwave photons). To measure this weak signal, low-noise Josephson amplifiers may be used as preamplifiers (i.e., first amplification stage) at the output of the quantum system to boost the quantum signal and improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

One type of Josephson amplifier is the Josephson Traveling Wave Parametric Amplifier (JTWPA), which is a distributed-element Josephson-based parametric amplifier. The device is formed by a nonlinear transmission line, whose center conductor comprises a large array of Josephson junctions, which are periodically shunted to ground with lumped-element capacitors. Since it is not a resonant structure, the amplification band in a JTWPA is typically large (e.g., 3 to 5 GHz). Such amplification range may be too large for qubit readout, which may be centered around 7 GHz. Known JTWPAs may amplify irrelevant signals during qubit readout such as qubit pulses, passing through, which could lead to instability. Moreover, they amplify quantum noise over a wideband. Further, the wide amplification band of known JTWPAs is very sensitive to impedance mismatches, which cause multiple reflections and in turn cause ripples in their gain curves. To minimize the effect of impedance mismatches at the input and output ports of the JTWPA, wideband devices that are 50-Ohm matched, such as magnetic based isolators, are often added at the input and output of the JTWPA. The addition of these wideband magnetic-based devices at the input and output of the JTWPA limits the integrability between the JTWPA and other microwave devices that are salient for the operation of the quantum processor. It is with respect to these concerns and others that this application has been written.

SUMMARY

According to various embodiments, a bandpass parametric amplifier circuit and method are provided. The bandpass parametric amplifier circuit includes a plurality of unit cells. At least one unit cell includes a first inductor having a first node coupled to a center conductor and a second node coupled to ground. There is a first capacitor having a first node coupled to the center conductor and a second node coupled to ground. There is a second inductor having a first node coupled to the center conductor. A second capacitor has a first node coupled to a second node of the second inductor. The second capacitor and the second inductor are in series with the center conductor.

In one embodiment, the first and second inductors are non-linear.

In one embodiment, the plurality of unit cells is part of a ladder circuit structure that creates the bandpass parametric amplifier circuit. The number of unit cells in the ladder circuit structure may be odd. Every multiple number of the unit cells may further include a resonant structure, including: a third capacitor having a first node coupled to the center conductor; a third inductor having a first node coupled to a second node of the third capacitor, and a second node coupled to ground; and a fourth capacitor having a first node coupled to the second node of the third capacitor, and a second node coupled to ground. In one embodiment, the multiple number is 3 to 9.

In one embodiment, the resonant structures in each of the multiple number of unit cells define a stopband in a gain curve of the bandpass parametric amplifier.

In one embodiment, the resonant structures in each of the multiple number of unit cells provide phase matching between a pump drive and a propagating in-band microwave signal amplified by the bandpass parametric amplifier.

In one embodiment, there is a third capacitor having a first node coupled to the center conductor. There is a third inductor having a first node coupled to a second node of the third capacitor, and a second node coupled to ground. There is a fourth capacitor having a first node coupled to the second node of the third capacitor, and a second node coupled to ground.

In one embodiment, the characteristic impedance of the bandpass filter is above 50 Ohm.

In one embodiment, the bandpass parametric amplifier is part of a circulator circuit.

In one embodiment, each of the first and second inductors comprises arrays of Josephson junctions.

In one embodiment, each Josephson junction comprises aluminum (Al) or niobium (Nb) superconducting electrodes.

In one embodiment, each of the first and second capacitors is constructed on a low-loss dielectric substrate in a coplanar waveguide geometry.

In one embodiment, the lumped-element capacitors in the bandpass parametric amplifier are plate capacitors that use low-loss dielectric materials.

In one embodiment, the bandpass parametric amplifier is a directional amplifier.

According to one embodiment, a Josephson based directional parametric amplifier includes a plurality of nonlinear distributed bandpass filters located along a transmission line, and linear elements that implement a periodic resonant structure loading for pump drives.

In one embodiment, each nonlinear distributed bandpass filter includes a first inductor having a first node coupled to a center conductor and a second node coupled to ground. There is a first capacitor having a first node coupled to the center conductor and a second node coupled to ground. There is a second capacitor having a first node coupled to the center conductor. There is and a second inductor having a first node coupled to a second node of the second capacitor. The second capacitor and the second inductor are in series with the center conductor.

In one embodiment, each periodic resonant structure, includes a third capacitor having a first node coupled to the center conductor a third inductor having a first node coupled to a second node of the third capacitor, and a second node coupled to ground. There is a fourth capacitor having a first node coupled to the second node of the third capacitor, and a second node coupled to ground.

In one embodiment, the periodic resonant structure is added every 3 to 9 of the nonlinear unit cells of the lumped-element bandpass filters.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure generally relates to superconducting devices, and more particularly, to efficient multiple readout of qubits. The electromagnetic energy associated with a qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. The amplitude and/or phase of the returned/output microwave signal carries information about the qubit state, such as whether the qubit is at the ground or excited states or at a superposition of the two states. The microwave signal carrying the quantum information about the qubit state is usually weak (e.g., on the order of a few microwave photons).

A readout of a qubit state is typically facilitated by a JTWPA, which is a distributed-element Josephson-based parametric amplifier. The device is formed by a nonlinear transmission line, whose center conductor comprises an array of Josephson junctions, which are periodically shunted to ground with lumped-element capacitors. Directional amplification of weak microwave signals traveling in the device is achieved by injecting a strong microwave drive, sometimes referred to as a pump, whose frequency lies near the center of the desired amplification band and whose propagation direction coincides with that of the input weak microwave signals.

Pumping the nonlinear Kerr medium (i.e., the Josephson junction array) with a strong coherent microwave drive gives rise to a four-wave mixing process, which results in parametric amplification of the propagating weak microwave signals. Stated differently, the distributed nonlinear medium enables amplification of weak microwave signals via coherent energy exchange with the propagating strong drive.

To ensure phase matching between the pump drive and the detuned weak microwave signals propagating in the distributed nonlinear medium, the center conductor is capacitively loaded by a resonant structure every few unit cells, which resonates near the pump frequency. This resonant loading creates a bandgap in the structure, which, in turn, facilitates phase matching.

Figure 1:
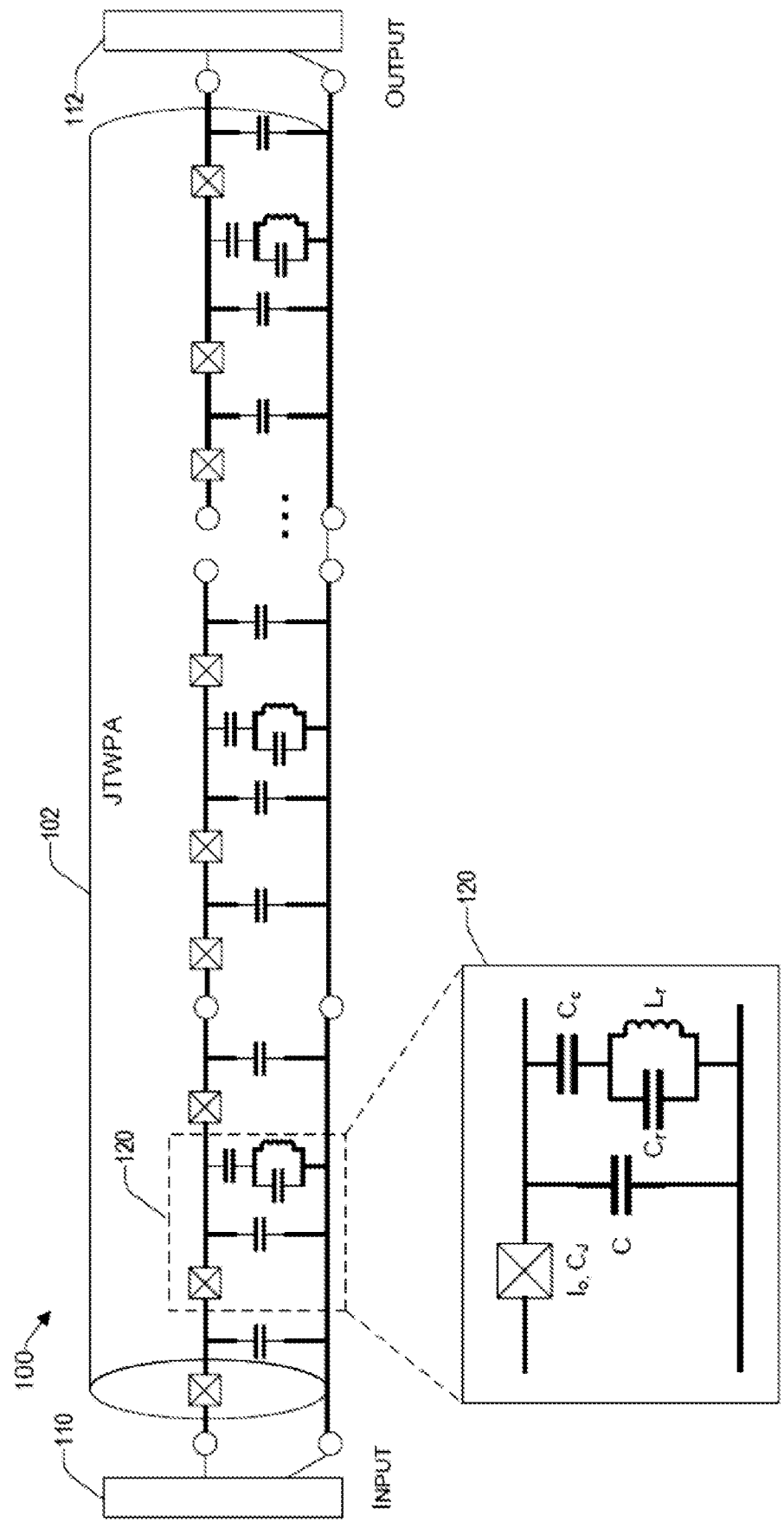
FIG. 1 illustrates a known JTWPA circuit.

FIG. 1 illustrates a known JTWPA circuit 100. The JTWPA circuit is implemented as a nonlinear lumped-element transmission line 102 coupled between an input 110 and an output 112. A unit cell 120 of the JTWPA includes a Josephson junction with a critical current $I_0$ and an intrinsic capacitance CJ and with a capacitive shunt to ground C. For example, every third unit cell, that includes the Josephson junction and the shunt capacitor to ground C, also includes a lumped-element resonator designated with a capacitance $C_r$ and inductance $L_r$, with the coupling strength set by a coupling capacitor $C_c$.

The JTWPA 102 of FIG. 1 can suffer a significant insertion loss (e.g., 4 dB or more). This loss arises mainly from dielectric loss in the plate capacitors that are part of the device. As mentioned previously, due to the distributed nature of the traveling-wave amplifier and its lack of resonant structures for the weak signals, the amplification bandwidth of the JTWPA 102 can be large (e.g., 3 to 5 GHz). Consequently, due to the wide amplification bandwidth, the JTWPA 102 amplifies quantum noise in an unwanted band, for example at qubit frequencies. Some of the amplified noise in the whole band can propagate back to the quantum system due to impedance mismatches in the output line.

Another drawback of the JTWPA 102 is that small impedance mismatches inside the JTWPA 102 or at the input 110 or output 112 ports can cause multiple reflections, which result in ripples in the gain curve of the JTWPA 102. Furthermore, due to the wide bandwidth, impedance matching between the amplifier and the 50 Ohm input and output circuitry, requires using broadband cryogenic isolators (e.g., 4 to 12 GHz) at the input 110 and output 112. It is noted that while providing a well-defined 50 Ohm environment over a wide band, these isolators protect the quantum system from noise coming back from the JTWPA or high-electron-mobility transistors (HEMT). However, these isolators are typically bulky, expensive, lossy, and use strong magnetic fields, which can negatively affect the JTWPA operation. Still further, these isolators are difficult to integrate on chip, which hinders scalability.

Accordingly, in one aspect, the teachings herein provide a Josephson-based directional parametric amplifier with medium-range bandwidths (e.g., 500 MHz-2000 MHz) centered around a frequency that is close to qubit readout frequencies (e.g., 7 GHz). Instead of a nonlinear transmission line as discussed above, a nonlinear distributed bandpass filter architecture is realized. Linear resonators that resonate at a center of the band are capacitively loaded into the nonlinear distributed bandpass filter. These resonators are integrated in every few unit cells (e.g., 3 to 9) to ensure phase matching between a pump drive and the propagating in-band weak microwave signals.

In one embodiment, to reduce the insertion loss of the bandpass filter (which is due to dielectric loss in plate capacitors), the teachings herein adopt two strategies. First, the bandpass filter is configured to have a relatively high characteristic impedance above 50 Ohm (e.g., 80 Ohm). Such increase in characteristic impedance, in general, decreases the capacitances in the amplifier device. To ensure proper impedance matching between the characteristic impedance of the filter and the input and output 50 Ohm environment, impedance matching networks are added at the input and output of the device (e.g., adiabatically tapered transmission lines).

Second, the lumped-element capacitance, which is part of the linear resonant circuits incorporated in the amplifier device for phase matching, can be reduced by realizing parallel LC circuits that have high characteristic impedances, i.e., larger than 50 Ohm, (e.g., use large inductances and smaller shunt capacitances to yield a higher characteristic impedance than 50 Ohm while maintaining the same resonance frequency of the linear resonant circuit). In one example, such high inductances can be achieved using thin and narrow superconductor layers that have large kinetic inductance.

By virtue of the bandpass parametric amplifier discussed herein a directional amplifier can amplify weak microwave signals with very little added noise (i.e., operating near the quantum limit). Further, it can be used to perform fast, high-fidelity quantum non-demolition (QND) measurement of qubits. Such near-quantum limited directional amplifier with medium-range bandwidth provides various advantages. For example, it considerably relaxes the requirement of having a 50 Ohm matching environment on the input and output ports matched over a wide band. Such flexibility from a strict matching environment allows the bandpass parametric amplifier to be compatible with microwave devices that have similar medium-range bandwidths, such as circulators, isolators, passive filters. Further, when amplifying readout signals of dispersively coupled qubits, the medium-range bandwidth of the bandpass parametric amplifier ensures that only qubit readout signals are amplified and not qubit signals. Such focused readout reduces unwanted backaction on the qubit (due to small impedance mismatches) and increases the stability of the device since it rejects qubit pulses that are out of band. Still further, the narrower bandwidth of the bandpass parametric amplifier (as compared to traditional JTWPAs) can reduce ripples in the gain curves as well as reduce the pump power required for the device operation.

Example Block Diagram

Figure 2:
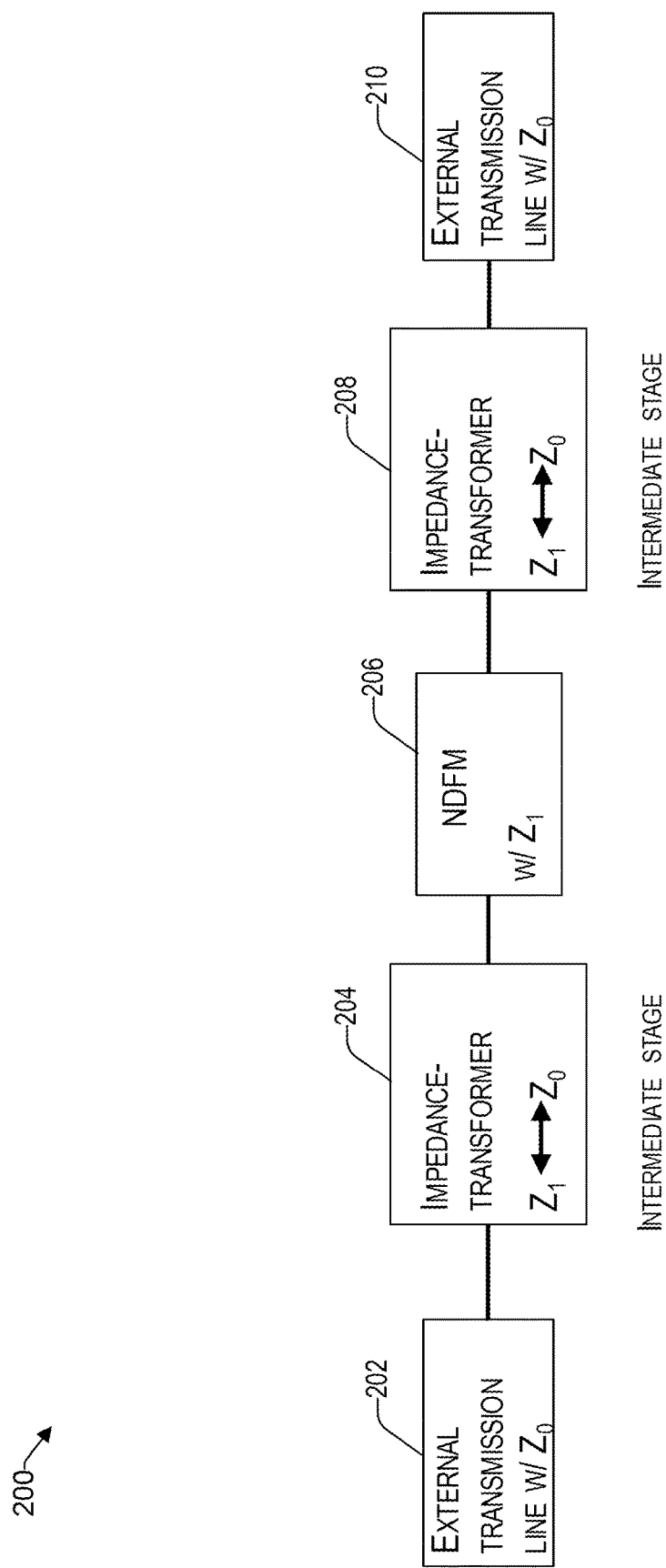
FIG. 2 is a block diagram of a bandpass Josephson traveling wave parametric amplifier system, consistent with an illustrative embodiment.

FIG. 2 is a block diagram of a band-pass Josephson traveling wave parametric amplifier system 200, consistent with an illustrative embodiment. The system 200 includes a nonlinear dispersive filtering medium (NDFM) 206 coupled between external transmission lines 202 and 210. For example, the first external transmission line 202 may be an input and the second external transmission line 210 may be an output. The external transmission lines 202 and 210 may each have a characteristic impendence of $Z_0$, which may be 50 Ohm. In various embodiments, there may be an intermediate stage between at least one of the external transmission lines 202 and 210, represented in FIG. 2 by intermediate stages 204 and 208. In one embodiment, an intermediate stage is an impedance transformer between $Z_1$ and $Z_0$. For example, these intermediate impedance matching networks/circuits are useful if the characteristic impedance of the nonlinear dispersive filtering medium, that lies at the heart of the bandpass Josephson traveling wave parametric amplifier, is $Z_1$, which is different than $Z_0$ (of the external ports).

Example Circuit Implementation of an NDFM

Figure 3:
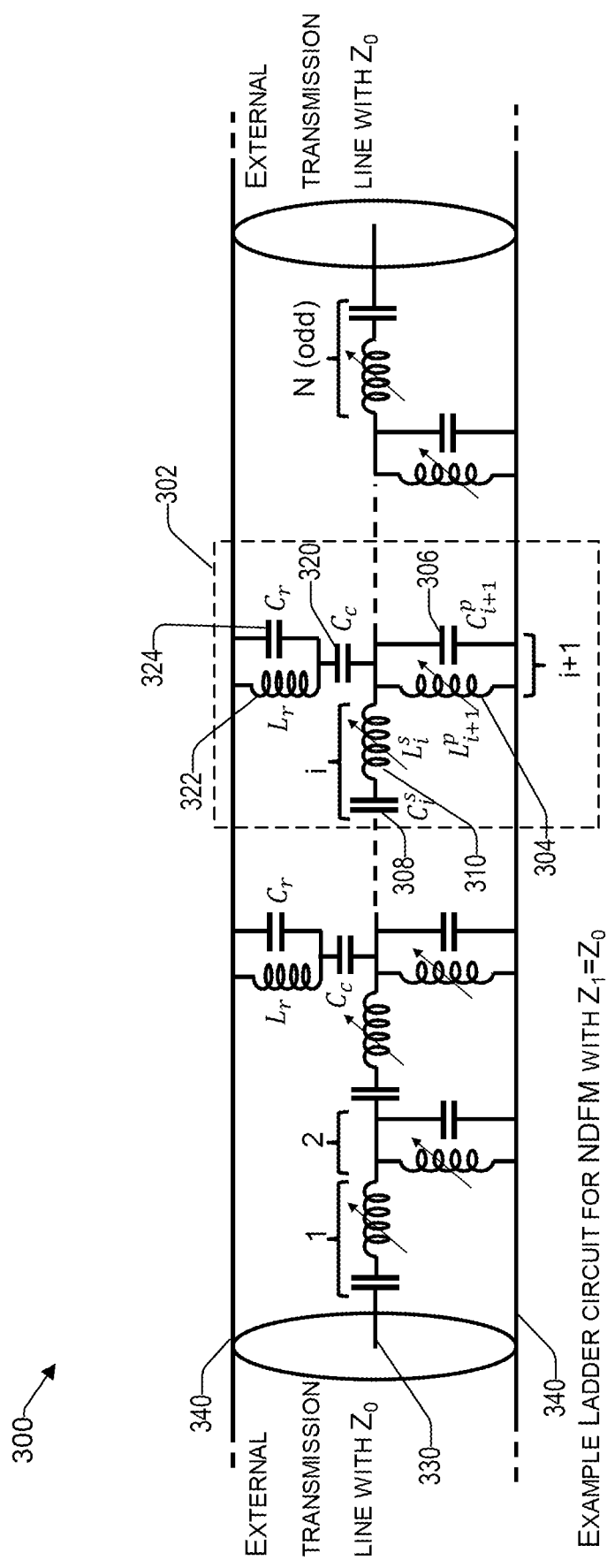
FIG. 3 illustrates an example circuit of a nonlinear dispersive filtering medium that can be used to implement the bandpass Josephson-based directional parametric amplifier block of FIG. 2, consistent with an illustrative embodiment.

Reference now is made to FIG. 3, which illustrates an example of a nonlinear dispersive filtering medium (NDFM) 300 that can be used to implement the NDFM 260 block of FIG. 2, consistent with an illustrative embodiment. The NDFM 300 is a distributed-element directional amplifier that comprises a ladder of lumped-element capacitors and inductors. The NDFM 300 includes a distributed nonlinear bandpass filter located along a transmission line. There are several linear elements that implement a periodic resonant structure loading for pump drives. An example of a periodic resonant structure, is illustrated in unit cell 302 by linear elements comprising capacitor $C_c$ 320, inductor $L_r$ 322, and capacitor $C_r$ 324. In one embodiment, a periodic resonant structure is added every 3 to 9 of the nonlinear filter elements and defines a narrow stopband in the gain curve of the NDFM 300, sometimes referred to as the dispersive feature of the amplifier.

In one embodiment, a unit cell 302 of the NDFM 300 includes a first inductor 304 having a first node coupled to a center conductor 330, and a second node coupled to ground 340 (e.g., at the outer portion of the structure of the NDFM 300). There is a first capacitor 306 in parallel with the first inductor 304. Stated differently, the first capacitor 306 has a first node coupled to the center conductor 330 and a second node coupled to ground 340. There is a second capacitor 308 having a first node coupled to the center conductor 330. There is a second inductor 310 having a first node coupled to a second node of the second capacitor 308, wherein the second capacitor and the second inductor are in series with the center conductor 330. A series of unit cells 302 results in a ladder circuit to create a NDFM 300.

In one embodiment, the unit cell 302 of the NDFM 300 further includes a periodic resonant structure comprising a third capacitor 320 having a first node coupled to the center conductor 330. There is a third inductor 322 having a first node coupled to a second node of the third capacitor 320, and a second node coupled to ground 340. There is a fourth capacitor 324 having a first node coupled to the second node of the third capacitor 320, and a second node coupled to ground 340. As mentioned previously, in one embodiment, the resonant structure is repeated every 3 to 9 of the nonlinear filter elements.

In some embodiments, at least one of the first and second inductors 304 and 310 is non-linear, as indicated by the arrow going through the inductor. For example, inductors 304, and 310 may include arrays of Josephson junctions. The number of unit cells 302, sometimes referred to herein as the bandpass filter order N, is odd (e.g., 101 to 1001). The filter order N is odd to keep the device symmetrical with respect to its two external ports.

The filtering characteristics of the NDFM 300 can be designed using the insertion loss method. In various embodiments, each unit cell 302 of the NDFM 300 can be designed according to a maximally flat (e.g., Butterworth response) or equal ripple (Chebyshev polynomials). The fractional bandwidth of the NDFM 300 is provided by equation 1 below:

$$\Delta = \frac{\omega_2 - \omega_1}{\omega_0} \quad \text{(Eq. 1)}$$

Where,
$\omega_0$ is the center angular frequency of the bandpass filtering medium;
$\omega_1$ is the lower angular cutoff frequency of the bandpass filtering medium;
$\omega_2$ is the upper angular cutoff frequency of the bandpass filtering medium;
and $\omega_2 > \omega_0 > \omega_1$.

In one embodiment, the center frequency of the bandpass parametric amplifier 300 (e.g., geometric mean of the cutoff angular frequencies $\omega_2$ and $\omega_1$) is provided by equation 2 below:

$$\omega_0 = \sqrt{\omega_1 \omega_2} \quad (2)$$

Depending on the order of the NDFM 300 and chosen ripple magnitude (i.e., the latter relevant for an equal ripple filter configuration), the appropriate element values g corresponding to a normalized source impedance and normalized cutoff frequency can be calculated using the known insertion loss method for designing filters.

Using the calculated or tabulated (in the literature) values $g_i$, the characteristic impedance of the filtering medium $Z_1$, the center angular frequency $\omega_0$, and the desired fractional bandwidth $\Delta$, one can calculate the values of the lumped-element inductors and capacitors using the equations below.

For Series Elements:

$$L_i^s = \frac{g_i Z_1}{\Delta \omega_0} \quad \text{(Eq. 3)}$$

$$C_i^s = \frac{\Delta}{\omega_0 g_i Z_1} \quad \text{(Eq. 4)}$$

For Parallel Elements:

$$L_{i+1}^p = \frac{\Delta Z_1}{\omega_0 g_{i+1}} \quad \text{(Eq. 5)}$$

$$C_{i+1}^p = \frac{g_{i+1}}{\Delta \omega_0 Z_1} \quad \text{(Eq. 6)}$$

The linear inductance of a Josephson Junction (JJ) is provided by equation 7 below:

$$L_{J0} = \frac{\varphi_0}{I_0} \quad \text{(Eq. 7)}$$

$$\varphi_0 = \frac{\Phi_0}{2\pi} \quad \text{(Eq. 8)}$$

$$\Phi_0 = h/(2e) \quad \text{(Eq. 9)}$$

Where,
Io is the critical current of the Josephson junction;
$\varphi_0$ is the reduced flux quantum;
h is Planck's constant; and
e is the electron charge magnitude.

In one embodiment, both lossless nonlinear inductances $L_i^s$ and $L_{i+1}^P$ (310 and 304) are implemented using arrays of JJ, wherein each has a linear inductance $L_{J0}$. The capacitive elements $C_i^s$ and $C_{i+1}^P$ (308 and 306) are implemented using superconducting plate capacitors with a low-loss dielectric material such as amorphous silicon, crystalline silicon, or Silicon Nitride. The NDFM 300 can be implemented on a low-loss dielectric substrate in coplanar waveguide geometry. The substrate can be high-resistivity silicon or sapphire.

In various embodiments, the JJ can comprise aluminum (Al) or Niobium (Nb). The linear inductors Lr (e.g., 322) may be a thin high kinetic inductor. The second capacitor 320 ($C_c$) and/or third capacitor 324 ($C_r$) of each unit cell 302 may be a superconducting plate capacitor with a low-loss dielectric material. The linear inductor 322 Lr, second capacitor 320 ($C_c$) and third capacitor 324 ($C_r$) of each unit cell 302, collectively implement a periodic resonant structure loading for the pump drives. In one embodiment, these elements are added every 3 to 9 filter elements. These elements define a stopband in the gain curve, also known as the dispersive feature of the amplifier. The center frequency of NDFM 300 is provided by equation 10 below.

$$\omega_0 \approx \frac{1}{\sqrt{L_r C_r}} \quad \text{(Eq. 10)}$$

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A bandpass parametric amplifier circuit, comprising:
    a plurality of unit cells, at least one of the unit cells comprising:
        a first inductor having a first node coupled to a center conductor and a second node coupled to ground;
        a first capacitor having a first node coupled to the center conductor and a second node coupled to ground;
        a second inductor having a first node coupled to the center conductor;
        a second capacitor having a first node coupled to a second node of the second inductor, wherein the second capacitor and the second inductor are in series with the center conductor, wherein:
        the plurality of unit cells is part of a ladder circuit structure that creates the bandpass parametric amplifier circuit; and
        every multiple number of the unit cells further includes a resonant structure.

2. The bandpass parametric amplifier of claim 1, wherein the first and second inductors are non-linear.

3. The bandpass parametric amplifier of claim 1, wherein a number of unit cells in the ladder circuit structure is odd.

4. The bandpass parametric amplifier of claim 1, wherein the resonant structure comprises:
    a third capacitor having a first node coupled to the center conductor;
    a third inductor having a first node coupled to a second node of the third capacitor, and a second node coupled to ground; and
    a fourth capacitor having a first node coupled to the second node of the third capacitor, and a second node coupled to ground.

5. The bandpass parametric amplifier of claim 1, wherein the multiple number is 3 to 9.

6. The bandpass parametric amplifier of claim 1, wherein the resonant structures in each of the multiple number of unit cells define a stopband in a gain curve of the bandpass parametric amplifier.

7. The bandpass parametric amplifier of claim 1, wherein the resonant structures in each of the multiple number of unit cells provide phase matching between a pump drive and a propagating in-band microwave signal amplified by the bandpass parametric amplifier.

8. The bandpass parametric amplifier of claim 1, wherein the characteristic impedance of the bandpass filter is above 50 Ohm.

9. The bandpass parametric amplifier of claim 1, wherein the bandpass parametric amplifier is part of a circulator circuit.

10. The bandpass parametric amplifier of claim 1, wherein each of the first and second inductors comprises arrays of Josephson junctions.

11. The bandpass parametric amplifier of claim 10, wherein each Josephson junction comprises aluminum (Al) or niobium (Nb) superconducting electrodes.

12. The bandpass parametric amplifier of claim 1, wherein each of the first and second capacitors is constructed on a low-loss dielectric substrate in a coplanar waveguide geometry.

13. The bandpass parametric amplifier of claim 1, wherein the bandpass parametric amplifier is a directional amplifier.

14. A method, comprising:
providing a plurality of unit cells;
for at least one of the unit cells:
providing a first inductor having a first node coupled to a center conductor and a second node coupled to ground;
providing a first capacitor having a first node coupled to the center conductor and a second node coupled to ground;
providing a second inductor having a first node coupled to the center conductor; and
providing a second capacitor having a first node coupled to a second node of the second inductor,
wherein the second capacitor and the second inductor are in series with the center conductor;
creating a bandpass parametric amplifier by using the plurality of unit cells as part of a ladder circuit structure; and
for every multiple number of the unit cells, including a resonant structure.

15. The method of claim 14, wherein the first and second inductors are non-linear.

16. The method of claim 14, wherein a number of unit cells in the ladder circuit structure is odd.

17. The method of claim 14, wherein including a resonant structure comprises:
providing a third capacitor having a first node coupled to the center conductor;
providing a third inductor having a first node coupled to a second node of the third capacitor, and a second node coupled to ground; and
providing a fourth capacitor having a first node coupled to the second node of the third capacitor, and a second node coupled to ground.

18. The method of claim 14, further comprising defining a stopband in a gain curve by the resonant structures realized in the multiple number of unit cells.

19. A Josephson based directional parametric amplifier, comprising:
a plurality of nonlinear distributed bandpass filters located along a transmission line; and
linear elements that implement a periodic resonant structure loading for pump drives,
wherein:
the plurality of unit cells is part of a ladder circuit structure that creates the bandpass parametric amplifier circuit; and
every multiple number of the unit cells further includes a resonant structure.

20. The amplifier of claim 19, wherein each nonlinear distributed bandpass filter comprises:
a first inductor having a first node coupled to a center conductor and a second node coupled to ground;
a first capacitor having a first node coupled to the center conductor and a second node coupled to ground;
a second inductor having a first node coupled to the center conductor; and
a second capacitor having a first node coupled to a second node of the second inductor, wherein the second capacitor and the second inductor are in series with the center conductor.

21. The amplifier of claim 19, wherein the periodic resonant structure is added every 3 to 9 of the nonlinear distributed bandpass filters.

* * * * *